United States Patent [19]

Sakama et al.

[11] Patent Number: 5,043,567
[45] Date of Patent: Aug. 27, 1991

[54] IMAGE SENSOR AND MANUFACTURING METHOD FOR THE SAME

[75] Inventors: Mitsunori Sakama; Takeshi Fukada; Naoya Sakamoto, all of Kanagawa; Nobumitsu Amachi, Kyoto; Shigenori Hayashi, both of Kanagawa; Takashi Inushima, Atsugi, all of Japan

[73] Assignee: Semiconductor Energy Laboratory Co., Ltd., Kanagawa, Japan

[21] Appl. No.: 525,734

[22] Filed: May 21, 1990

Related U.S. Application Data

[62] Division of Ser. No. 211,225, Jun. 22, 1988, Pat. No. 4,943,710.

[30] Foreign Application Priority Data

Jun. 25, 1987 [JP] Japan .................................. 62-158334
Jun. 30, 1987 [JP] Japan .................................. 62-162925

[51] Int. Cl.$^5$ .............................................. H01J 40/14
[52] U.S. Cl. ............................. 250/208.1; 219/121.68
[58] Field of Search ............ 250/211 R, 208.1, 208.2; 219/121.67, 121.68, 121.69

[56] References Cited

U.S. PATENT DOCUMENTS 4,272,775 6/1981 Compton et al. ............... 219/121.68
4,568,409 2/1986 Caplan ............................ 219/121.68

Primary Examiner—David C. Nelms
Attorney, Agent, or Firm—Sixbey, Friedman, Leedom & Ferguson

[57] ABSTRACT

A method of manufacturing image sensors where (a) a first conductive film of a transparent material is formed over and in contact with a transparent substrate; (b) a photosensitive semiconductor film is formed over and in contact with the film; (c) the first conductive film and the semiconductor film are patterned by laser scribing; (d) a first insulating film is formed over the above films and in contact with the first conductive film and the semiconductor film and portions thereof are removed which are not necessary to define the image sensors in the patterned semiconductor film; (e) a second conductive film is formed over the semiconductor film and the remaining portions of the first insulating film in order to make contact with the semiconductor film; (f) the second conductive film is patterned; (g) a second insulating film is formed over and in contact with the second conductive film; (h) the second insulating film is patterned; and (i) an electrode arrangement is formed for withdrawing electrical signals from the second conductive film through the patterned second insulating film, wherein the patternings of the first conductive film, the second conductive film, and the second insulating film are primarily performed by laser scribing to reduce the fabrication cost of the image sensors.

5 Claims, 10 Drawing Sheets

5,043,567

IMAGE SENSOR AND MANUFACTURING METHOD FOR THE SAME

This is a divisional application of Ser. No. 07/211,225, filed June 22, 1988, now U.S. Pat. No. 4,943,710.

BACKGROUND OF THE INVENTION

This invention relates to an image sensor and manufacturing method for the same.

As prior art solid image sensors, CCD or MOS image sensors have been used. While these image sensors are useful for some applications, it is difficult to design them suitable for photo-copying machine in the form of a linear strap which can span the length of an original paper. A number of sensor segments arranged along the linear strap can indivusually detect illumination.

In recent years, the development of contact image sensors has been broadly the subject of reseachers. Image sensors of this type are provided with fine structure on a broad substrate in which eight sensors are arranged across each 1 mm width. One of the difficulties in producing such a fine structure is appropriate designing of etching process. Wet-etching having a short process time is not suitable since micro-scale treatment must be done on a wide substrate. For this reason, dry-etching has been employed instead. In the latter case, it is very difficult to etch a thin semiconductor film throughout the wide area of a substrate.

SUMMARY OF THE INVENTION

It is therefore an object of the invention to provide am image sensor which can pick up visual information quickly and exactly.

It is another object of the invention is to provide a method of manufacturing image sensors at low cost.

DETAILED DESCRIPTION OF THE PREFERRED EMBODIMENTS

Figure 1:
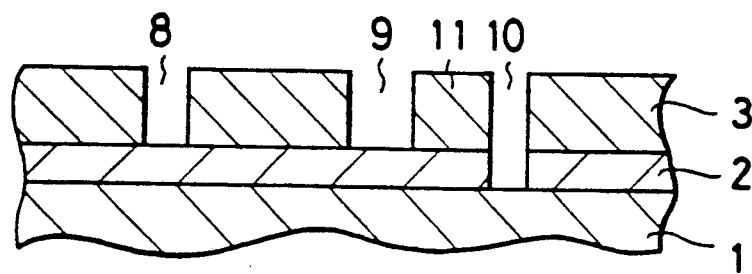
FIGS. 1(A), 1(B), 1(C), 1(D) and 1(E) are cross sectional views showing a manufacturing process of an image sensor in accordance with the present invention.
Figure 1:
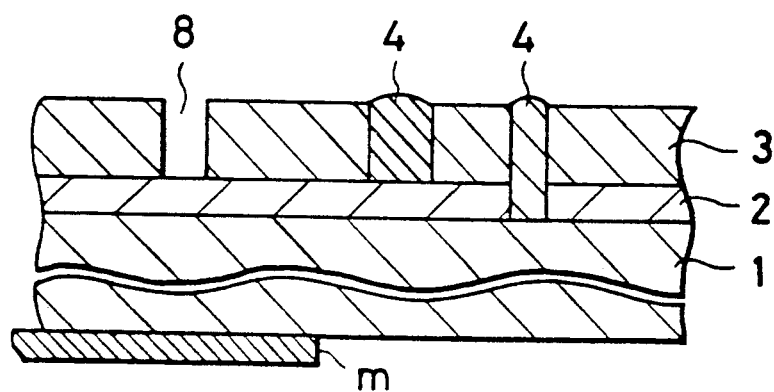
Figure 1:
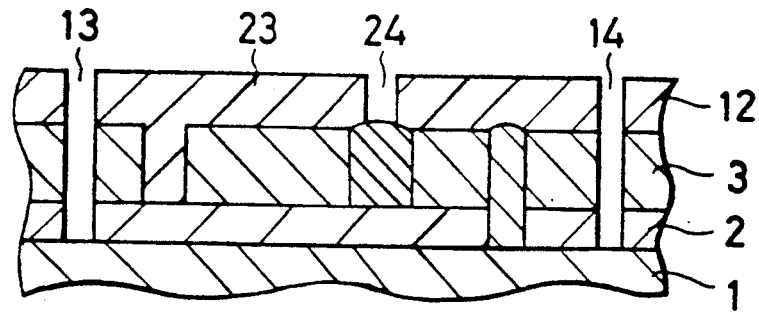
Figure 1:
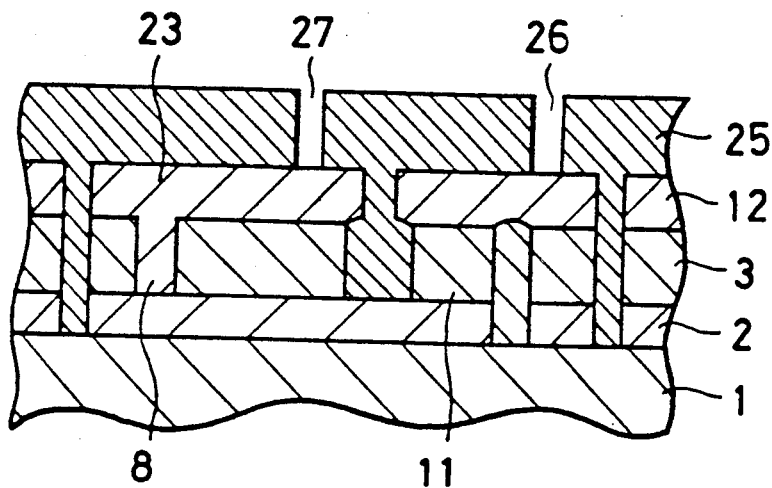
Figure 1:
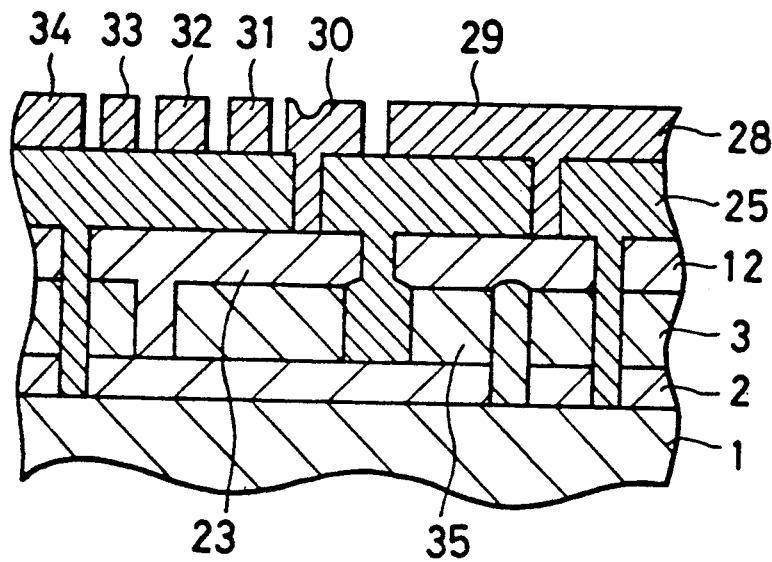
Figure 2:
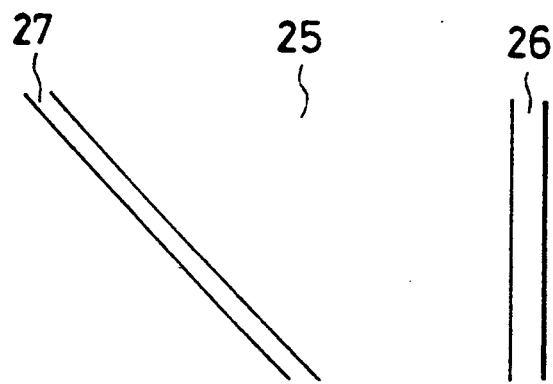
FIGS. 2(A), 2(B), 2(C), 2(D) and 2(E) are plan views showing a manufacturing process of an image sensor in accordance with the present invention.
Figure 2:
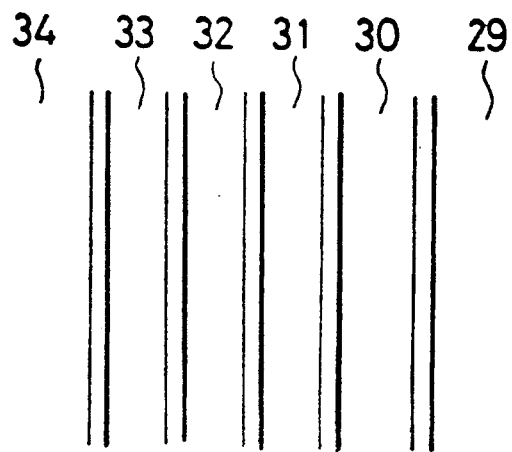
Figure 2:
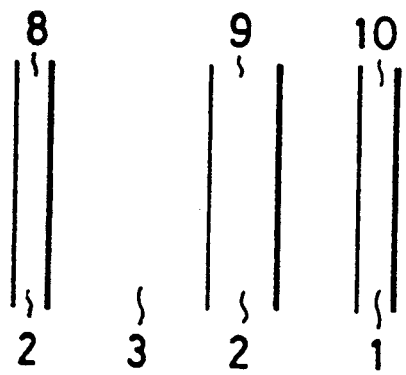
Figure 2:
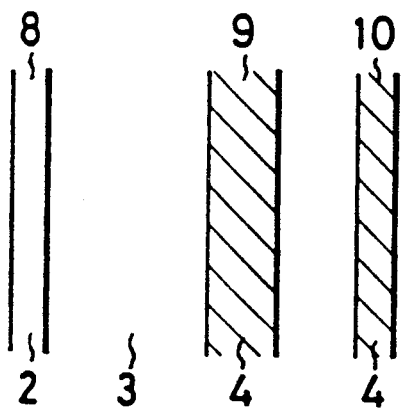
Figure 2:
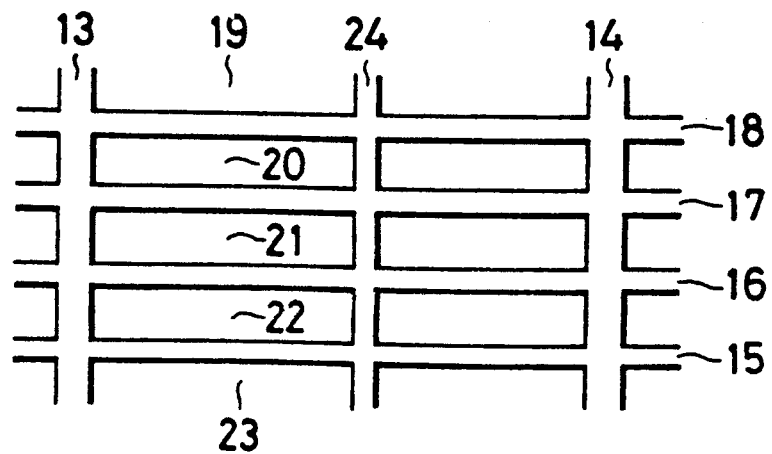
Figure 3:
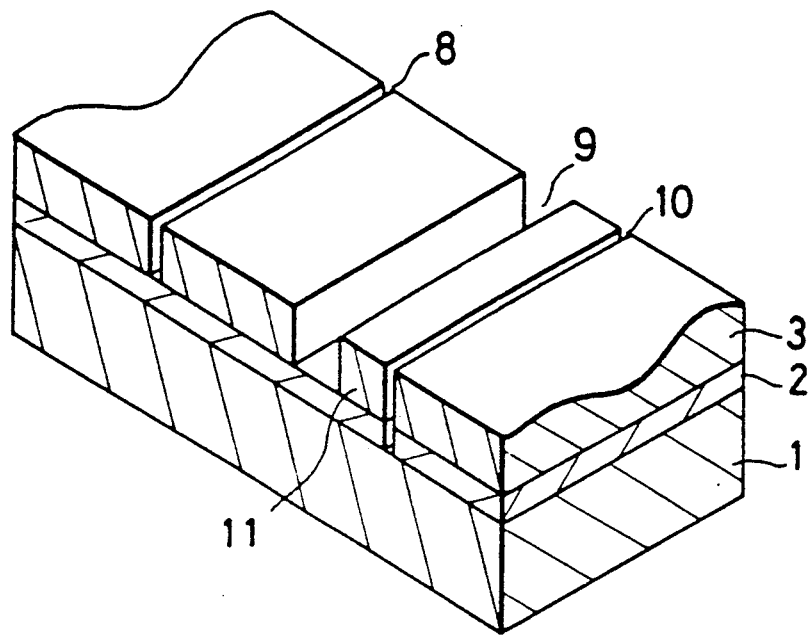
FIGS. 3(A), 3(B), 3(C), 3(D) and 3(E) are perspective views showing a manufacturing process of an image sensor in accordance with the present invention.
Figure 3:
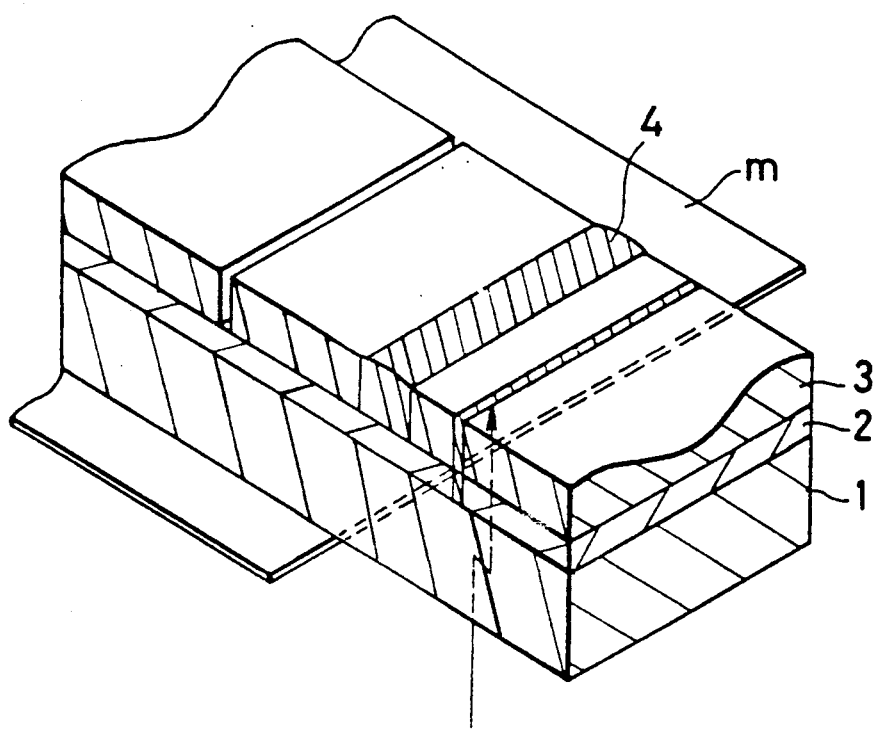
Figure 3:
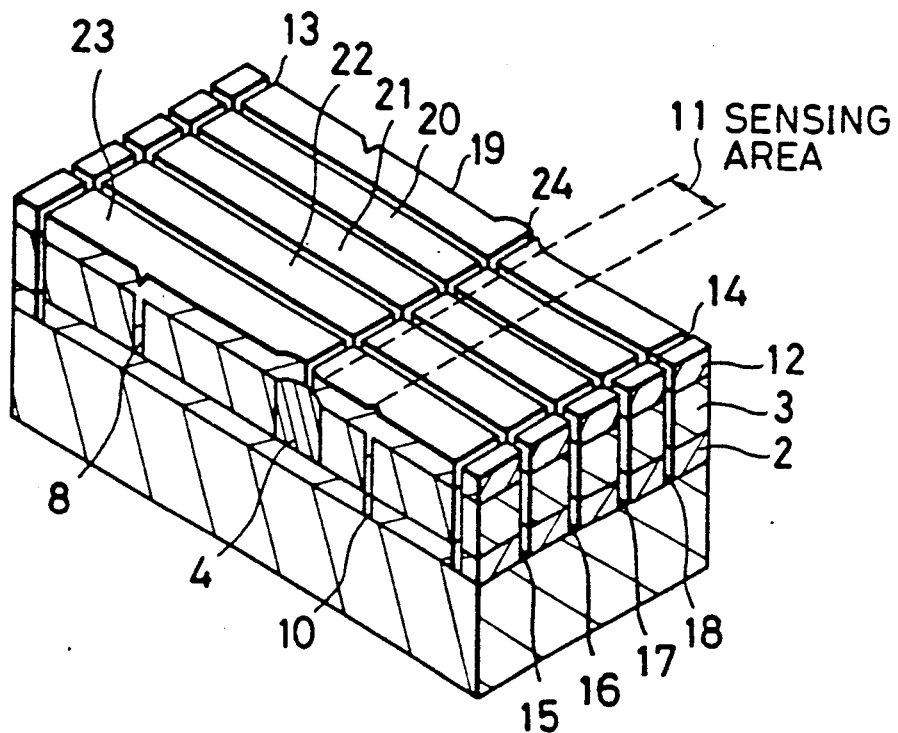
Figure 3:
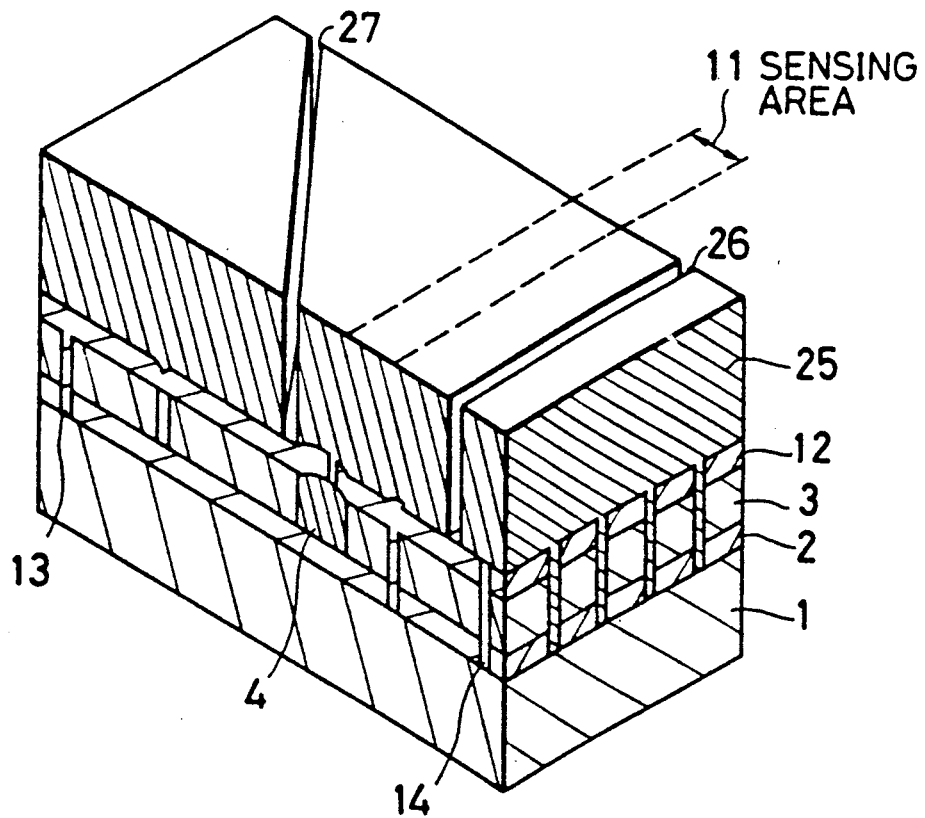
Figure 3:
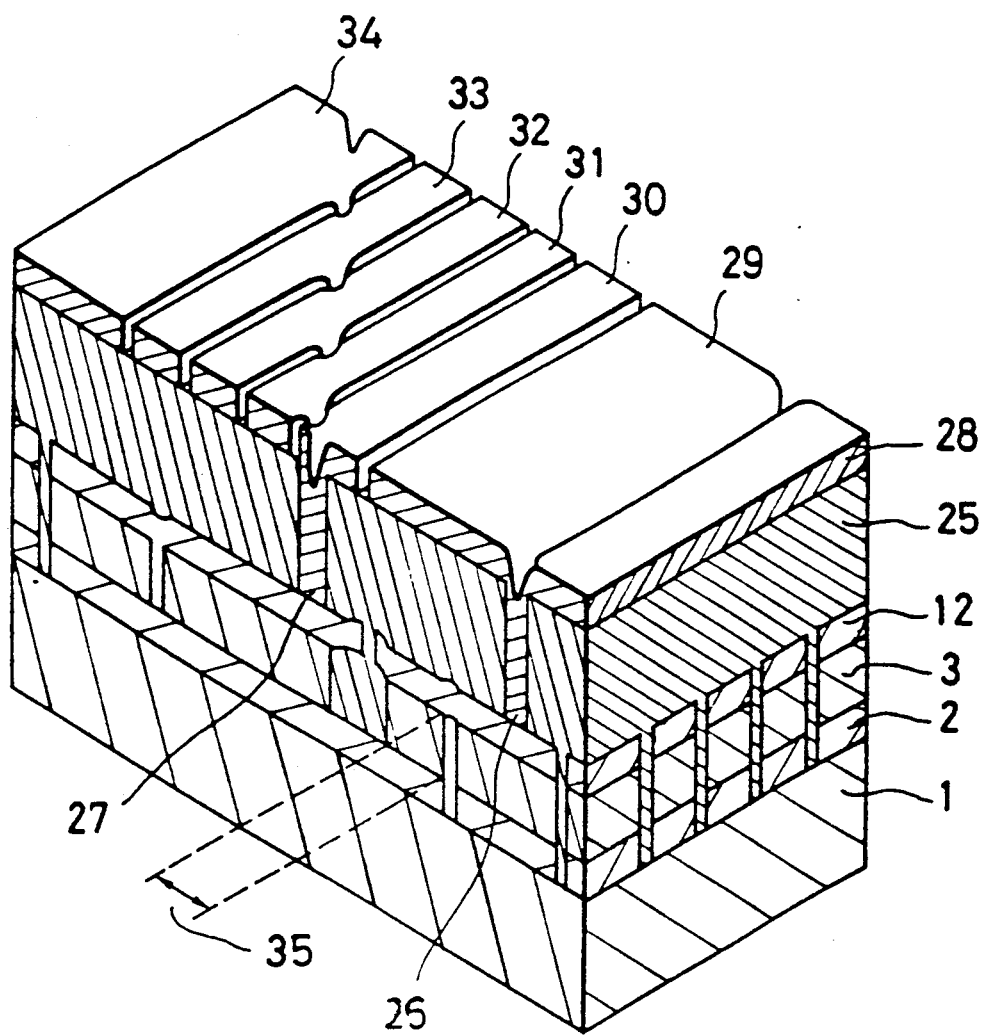

Referring to FIGS. 1, 2 and 3, a manufacturing method in accordance with the present invention will be described. FIGS. 1(A) to 1(E), FIGS. 2(A) to 2(E) and FIGS. 3(A) to 3(E) are vertical cross sectional views, plane views and perspective views respectively showing the manufacturing process of an image sensor.

A 5000 Å thick $SnO_2$ film 2 is deposited on the entire surface of a glass substrate of 100 mm×250 mm by a known CVD method. As the semiconductor device for performing photo-electric conversion, a 1 micron thick amorphous silicon semiconductor film 3 is deposited with an NIN junction incorporated therein on the $SnO_2$ film 2 by a known plasma CVD method. Other photosensitive junctions such as PIN and IN can be used in place of the NIN junction.

To form grooves 8, 9 and 10, the films 2 and 3 are irradiated with a laser beam from a KrF eximer laser having a wavelength of 248 nm. The laser beam is shaped with a cross section 20 micron wide 300 mm length by expanding in one direction and contracted in a perpendicular direction. The groove 8 is engraved for electrode connection. The groove 10 reaching to the $SO_2$ film and the groove 9 are engraved for defining the sensor segments therebetween. In order that the groove 10 severes the $SnO_2$ film 2 and the grooves 8 and 9 don't severe the $SnO_2$ film 2, the number of irradiation of laser pulse is adjusted in the case. Laser beam pulse with 20–100 namo seconds, e.g. 50 namo seconds in pulse width is radiated 6 times for each of the grooves 8 and 9 and radiated 10 times for the groove 10.

The width of the sensor region between the grooves 9 and 10 is 100 microns. The widths of the grooves 8 and 10 are 20–25 microns which is nearly the width of laser beam. Although the width of the groove 9 can be equal to those of the grooves 8 and 10, it is selected to be about 50 microns in this embodiment for the purpose of providing a margin for the following alignment process.

Over the upper surface of the structure illustrated in FIG. 1, a photosensitive organic resin film, such as polyimide is coated by a spinner and subjected to pre-baking at 80° C. for an hour. The organic resin is exposed to ultraviolet light around 400 nm in wavelength at 3.55 mW/cm$^2$ which enters from the bottom surface of the glass substrate 1 with a mask m hiding the groove 8 from the light illumination. After exposure for 5 minutes, the organic resin film is developed by a developer and removed except for the portion present in the grooves 9 and 10, which are designated by reference numeral 4 in the figures.

A 3000Å thick alminium film 12 is coated on the structure in order to make electrical contact with the $SnO_2$ film 2 through the groove 8. Grooves 13, 14, 15, 16, 17 and 18 severing the structure into indivisual sensor segments are engraved respectively by 10–15 times irradiation with a laser beam at intervals of 100 microns. These grooves are formed so deep to completely severe the layer structure including the $SnO_2$ film 2 into electrically isolated indivisual sections.

Next, grooves 24 is formed in order to provide segment electrodes 19, 20, 21, 22 and 23 as shown in FIGS. 1(C), 2(C) and 3(C) by 5 times laser beam irradiation in the same way as described above. In this case, a portion of the insulating film 4 may be removed as well as the overlying electrode film 12. The groove 24 partially overlaps the aforementioned grooves 9. The center positions of the groove 24 is displaced out of the center of the groove 9 toward the segment electrode 23.

Furthermore, a 5000Å thick polyimide film 25 is coated on the structure, followed by post-baking at 100° C. for an hour. The polyimide film is patterned by 5 times laser pulse irradiation in order to provide a groove 26 for taking out the signal from the common electrode underlying and a groove 27 for taking out the signal from the segment electrode 23 as illustrated in FIGS. 1(D), 2(D) and 3(D). The electrode 27 is formed slanted with respect to the segment electrodes.

Furthermore, a 300Å aluminium film 28 is coated over the upper surface of the structure and patterned by 5 times laser pulse irradiation in order to provide common electrodes 29 and segment electrodes 30, 31, 32, 33 and 34. The film 28 makes contact with the the aluminium film 12 through the grooves 26 and 27 as shown in FIGS. 1(E), 2(E) and 3(E). Accordingly, the segment electrodes 30, 31, 32, 33 and 34 are connected to the underlying segment electrodes 23, 22, 21 and 20 thorugh the slanted groove 27. Then, a contact image sensor is completed.

In what follow, a driving circuit suitable for this image sensor will be described.

Figure 4:
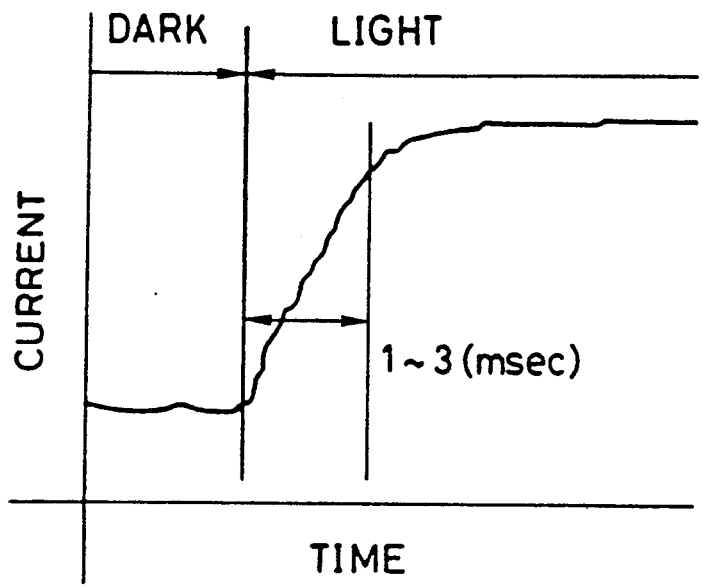
FIG. 4(A) is a graphical diagram showing the response of an NIN junction to illumination.
FIG. 4(B) is a graphical diagram showing the response of an NIN junction when illumination to the junction is removed.
Figure 4:
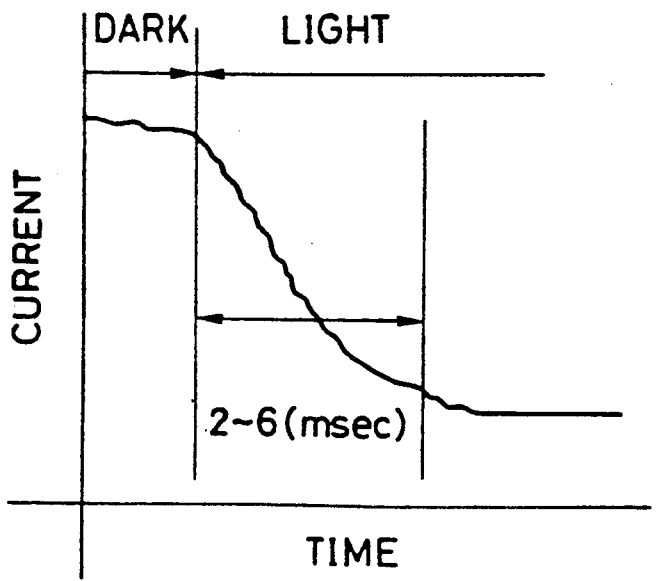
Figure 5:
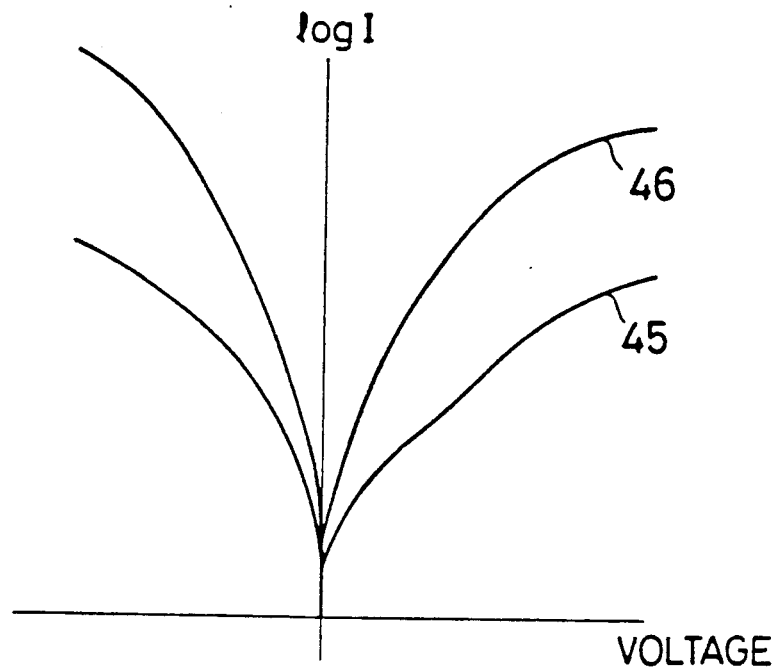
FIG. 5 is a graphical diagram showing the current-voltage characteristics of an NIN junction exposed to and not to illumination (100Lx), where the current level is ploted in terms of common log.

FIGS. 4(A) and 4(B) are graphical diagrams showing the variation of current passing through an NIN junction with 10 V thereacross when light illumination is applied or removed. As shown in the figures, the 90% rise time from the dark condition to light condition of the NIN junction is 1-3 microseconds and the 90% fall time from the light condition to the dark condition is 2-6 microseconds. FIG. 5 is a graphical diagram showing the voltage-current characteristic of the junction. The abscissa is applied voltage ($-10$ V to $+10$ V) while the ordinate is common log of passing current. Curve 45 is plotted in case without irradiation and curve 46 in case with irradiation. From this figure, it will be noted that the current passing through the junction increases as the junction is exposed to illumination. When the applied voltage exceeds a certain level, the current increases exponentially.

Figure 6:
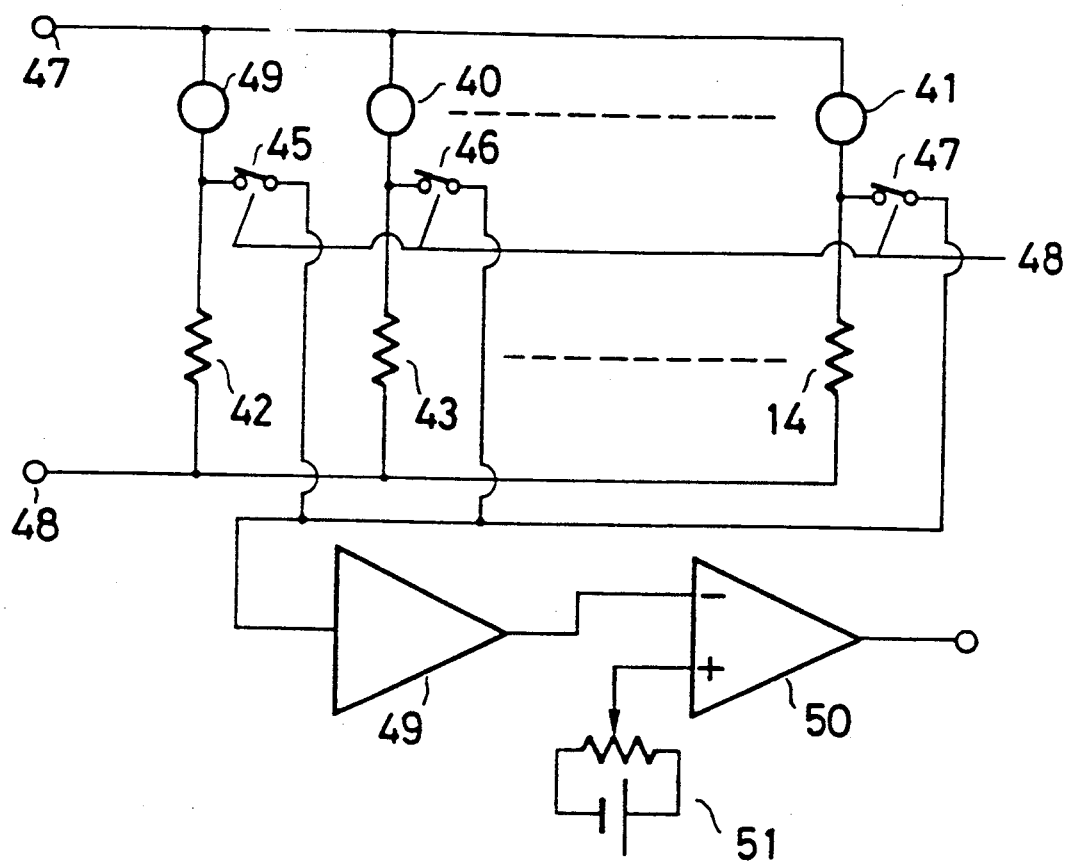
FIG. 6 is a circuit diagram showing a driving circuit for image sensor.

Referring now to FIG. 6, a driving circuit suitable for this image sensor is schematically illustrated. In the figure, the image sensor consists of sixty four sensor segments 49, 50, . . . , 51 each of which has been made as described in the above. An NIN (or NIN$^-$NN$^+$) junction is incorporated in the sensor segments. A voltage Vo is applied to the sensor segments through a pair of terminals 47 and 48 between which the sensor segments are arranged in parallel. The sensor segments are connected with a multiplexer 45, 46, . . . , and 47 and resistances 12, 13, . . . , and 14. The multiplexer allows one of the sensor segments to output therethrough in accordance with the digital singal supplied from a address generator 58. The output signal of the multiplexer is input to a high impedance buffer 59. The buffer 59 is a voltage follower having an operational amplifier. The output of the buffer is input to one input terminal of a comparison circuit 60, the other terminal being connected to a voltage divider 61.

Under a predetermined voltage applied to the terminals 47 and 48, each sensor segment produces a certain voltage level at its connection point with a corresponding resistance in accordance with whether or not that segment receives light. The voltage levels of the sensor segments are scanned and detected successively by supplying address signals to the multiplexer from the generator. Accordingly, visual information can be detected in terms of binary codes.

Figure 7:
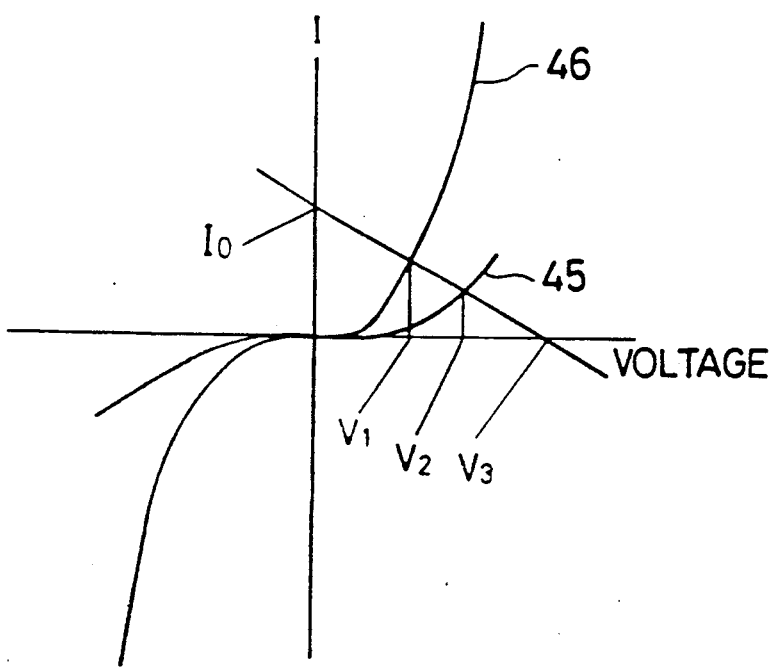
FIG. 7 is a graphical diagram showing the current-voltage characteristics of an NIN junction exposed to and not to illumination (100Lx).

The value of the resisters is important. This value is determined by the following process in order to enable optimal operation of the driving device. Reference is made to FIG. 7.

1) To investigate the current-voltage characteristic of the sensor segment over a voltage range upto the voltage level Vo that is to be applied between the terminals 47 and 48 in both the cases where the sensor segment is and is not irradiated with light. Curve 5 represents in case without irradiation and curve 6 represents in case with irradiation.

2) To draw a straight line intersecting the line of abscissa at Vo and obtain the abscissae $V_1$ and $V_2$ of the points at which the curve 5 and the curve 6 intersect the straight line.

3) To determine th straight line as drawn by the previous step 2) in order to make $V_1$-$V_2$ maxmum.

4) To calculate the value of the resistances based on that line determined by the step 3).

While a description has been made for several embodiments, the present invention should be limited only by the appended claims and should not be limited by the particualr examles. What follow are some examples of modifications and variation according to the invention.

Although the common electrode is formed of the transparent conductive film underlying the photosensitive semiconductor film while the segment electrode is formed of the alminium film overlying the semiconductor film, the levels of the two electrodes can be switched.

By modify the above described process in suitable combination of laser scribing and insulating film formation, sensor segments can be two-dimensionally arranged.

We claim:

1. A method of manufacturing image sensors comprising:

forming a first conductive film of a transparent material over and in contact with a transparent substrate;

forming a photosensitive semiconductor film over and in contact with said film;

patterning said first conductive film and said semiconductor film by laser scribing;

forming a first insulating film over aforesaid films and in contact with said first conductive film and said semiconductor film and removing portions thereof which are not necessary to define the image sensors in the patterned semiconductor film;

forming a second conductive film over said semiconductor film and the remaining portions of the first insulating film in order to make contact with said semiconductor film;

patterning said second conductive film;

forming a second insulating film over and in contact with said second conductive film;

patterning said second insulating film; and forming an electrode arrangement for withdrawing electrical signals from said second conductive film through the patterned second insulating film, wherein the patternings of the first conductive film, the second conductive film, and the second insulating film are primarily performed by laser scribing to reduce the fabrication cost of the image sensors.

2. The method of claim 1 wherein, in addition to all of the patterning steps of claim 1, said semiconductor film is sectioned to form a plurality of sensor segments arranged in a line where each sensor segment corresponds to one of said image sensors.

3. The method of claim 2 wherein said first and second conductive film are severed in said sectioning step to form electrodes for respective said sensor segments.

4. The method of claim 3 wherein said semiconductor film and one of said first and second conductive films are severed into said sensor segments and electrodes respectively corresponding to the sensor segments where the electrodes are formed from said second conductive film and where the sensor segments and the electrodes are formed at the same time by laser scribing.

5. The method of claim 4 wherein a groove is formed through said second insulating film in order to diagonally traverse said sensor segments, and said electrode arrangement includes a plurality of electrode strips each of which extends in the direction perpendicular to the direction of said line of sensor segments and which respectively make contact with said sensor segments through said last-mentioned groove.

* * * * *